US006538509B2

(12) United States Patent
Ren

(10) Patent No.: US 6,538,509 B2
(45) Date of Patent: Mar. 25, 2003

(54) LINEARIZER FOR A POWER AMPLIFIER

(75) Inventor: Qiming Ren, Kanata (CA)

(73) Assignee: Dragonwave Inc., Kanata (CA)

( * ) Notice: Subject to any disclaimer, the term of this patent is extended or adjusted under 35 U.S.C. 154(b) by 0 days.

(21) Appl. No.: 10/093,445

(22) Filed: Mar. 11, 2002

(65) Prior Publication Data

US 2002/0125947 A1 Sep. 12, 2002

Related U.S. Application Data

(60) Provisional application No. 60/274,212, filed on Mar. 9, 2001.

(51) Int. Cl.[7] .................................... H03F 1/26

(52) U.S. Cl. .................................... 330/149; 330/124 R

(58) Field of Search .................................... 330/149, 124 R, 330/295, 84

(56) References Cited

U.S. PATENT DOCUMENTS 3,202,928 A * 8/1965 Prior .................... 330/124
4,392,252 A * 7/1983 Cluniat .................... 455/116
5,576,660 A * 11/1996 Pouysegur et al. .................... 330/149
5,703,531 A * 12/1997 Vaughn et al. .................... 330/149
6,377,118 B1 * 4/2002 Shigaki et al. .................... 330/149

OTHER PUBLICATIONS

"Predistortion Linearizer using GaAs Dual–Gate MESFET for TWTA and SSPA used in Satellite Transponders"; M. Kumar, J.C. Whartenby, H.J. Wolkstein; pp. 1479–1488; 1985.

"Broadband and Broad Dynamic Range GaAs Dual–Gate MESFET Linearizer for TWTA and SSPA used in Satellite Transponder"; M. Kumar, J.C. Whartenby, H.J. Wolkstein; pp. 609–612; 1985.

"An 18GHZ–Band MMIC Linearizer using a Parallel Diode with a Bias Feed Resistance an a Parallel Capacitor"; K. Yamauchi, M. Nakayama, Y. Ikeda, H. Nakaguro, N. Kadowaki, T. Araki; Mitsubishi Electric Corporation, Communications Research Laboratory; 2000.

* cited by examiner

*Primary Examiner*—Henry Choe

(57) ABSTRACT

A predistortion linearizer for a microwave power amplifier comprises a signal separator for receiving a signal and dividing the signal into first and second signals, a first path for carrying the first signal and a second path for carrying the second signal, and a signal combiner for combining the signals from the first and second paths. The second path between the separator and combiner includes a non-linear device for receiving the second signal and generating distortion therefrom, and a vector modulator for controlling at least one of the amplitude and phase of the second signal.

19 Claims, 4 Drawing Sheets

LINEARIZER FOR A POWER AMPLIFIER

This application claims the benefit of No. 60/274,212, filed Mar. 9, 2001.

FIELD OF THE INVENTION

The present invention relates to a linearizer for a power amplifier and in particular but not limited to a linearizer for a microwave power amplifier,

BACKGROUND OF THE INVENTION

In modern communication systems, linearized power amplifiers have found wide use. This is mainly due to the availability of highly efficient power amplifiers (PA), spectral efficient digital multi-state modulation techniques, and the requirement fox multi-carrier operation. Digital multi-state signals and multi-carrier signals are very sensitive to non-linearities of the PA, which cause unwanted interference to be produced. The unwanted interference is mainly produced by Amplitude Modulation to Amplitude Modulation (AM-AM) conversion and Amplitude Modulation to Phase Modulation (AM-PM) conversion in the power amplifier. A traditional way to reduce the unwanted interference is to back-off the PA from its saturated output power. Back-offs of 10 to 20 dB are common which causes the power efficiency of whole system to be greatly reduced. The unwanted interference generated by the amplifier non-linearities can be especially serious if multiple carriers or multi-state digitally modulated signals are applied to the PA. This is because the peak power of multiple carriers and the multi-state digitally modulated signals are much higher than their average powers. Commonly, the peak power can range from 3 to 20 dB or higher than the average power depending on the numbers of carriers and modulation technique. These higher peak powers cause the signals to enter the saturated regions of the PA sooner and increase their sensitivity to the non-linearities of the PA. In order to increase power efficiency of the system, linearization techniques must be applied in the PA. Solutions so do this include feedback techniques, Cartesian feedback, feedforward, predistortion, LINC linearized transmitter, Kahn envelope elimination and restoration (EER) techniques and many other techniques.

Among these techniques, predistortion is the most popular, especially the RF analogue predistorter that is suitable for application to the high frequency and millimeter wave bands. Many different types of predistorters have been proposed. One implementation employs two variable gain amplifiers as described in M. Kumar, J. C. Whartenby and H. J. Wolkstein, "Predistortion Linearizer Using GaAs Dual-Gate MESFET for TWTA and SSPA Used in Satellite Transponders", IEEE Trans. On MTT, Vol. MTT-33, pp. 1479–1488, No. 12, 1985, and U.S. Pat. No. 5,576,660. However, there are still some problems concerning bandwidth and cost because hybrids limit the bandwidth and many components are used to adjust the predistorter. All of these can increase the cost. Another problem that limits the bandwidth is the memory effect caused by the predistorter. Even though two ideal flat variable gain amplifiers are applied, the predistorter can still have a slope over the bandwidth. The slope will significantly affect linearization in wideband applications.

In the implementation described by M. Kumar, J. C. Whartenby and H. J. Wolkstein, "Predistortion Linearizer Using GaAs Dual-Gate MESFET for TWTA and SSPA Used in Satellite Transponders", IEEE Trans. On MTT, Vol. MTT-33, pp. 1479–1488, No. 12, 1985, two dual gate MESFET variable gain amplifiers are adopted. It was realized in a hybrid Microwave Integrated Circuit (MIC) technique, that many tunings are needed to ensure that the predistorter produces proper distorted signals, especially for the phase difference between the linear path and non-linear path. It is a difficult thing to choose two amplifiers that can satisfy the phase difference requirement. Another problem concerning the implementation is the bandwidth. Normally, a 90° hybrid has limited bandwidth of only 10%. If 20% bandwidth or more is needed, a new design is required and this will increase design costs.

In the implementation described in U.S. Pat. No. 5,576,660, two identical voltage controlled phase shifters, two identical voltage controlled attenuators and two identical amplifiers are used. Two voltage controlled phase shifters make it relatively easy to control the phase difference between the linear path and the nonlinear path. But they are costly to manufacture, especially for the application to mm-wave band. The predistorter is the same as the first realization in that a 90° hybrid is adopted This hybrid limits the bandwidth if wideband is needed.

SUMMARY OF THE INVENTION

According to one aspect of the present invention, there is provided a predistortion linearizer comprising a signal separator for receiving a signal and for dividing the signal into a first signal and a second signal, a first path for caring the first signal, a second path for carrying the second signal, a signal combiner for combining the signals from the first and second paths, the second path between the separator and combiner including a non-linear device for receiving the second signal and generating distortion therefrom, and a vector modulator in one of the first and second paths for controlling at least one of the amplitude and phase of the signal carried by the respective path, the vector modulator comprising a second signal separator for dividing the signal carried by the respective path into a first modulator signal and a second modulator signal, a first modulator path for carrying the first modulator signal, a second modulator path for carrying the second modulator signal, and a second signal combiner for combining the first and second modulator signals received from the first and second modulator paths, the vector modulator including means for producing a phase difference between the first modulator signal and the second modulator signal, and wherein the first modulator path includes amplitude controlling means for controlling the amplitude of the first modulator signal, and the second modulator path includes amplitude controlling means for controlling the amplitude of the second modulator signal.

Advantageously, in this arrangement of a predistortion linearizer, the means for controlling the amplitude and chase of the distorted signal is provided by vector modulator means which allows the predistortion linearizer circuit to be considerably simplified and the number of components and required control signals to be reduced over known predistortion linearizers.

In one embodiment, the vector modulator may include means for dividing the distorted signal into first and second modulator signals, means for providing a phase difference between the two signals, and means for varying the amplitude of each signal independently of the other, and a signal combiner to combine the first and second modulator signals. Advantageously, this arrangement enables the phase and amplitude of the distorted signal to be varied independently of one another using just two control signals, each of which is used to control the amplitude of the modulator signals.

In one embodiment, the signal separator may comprise a wideband separator, for example having a bandwidth of at least 20% of the center frequency of the input signal. The signal combiner may also be a wideband signal combiner having a bandwidth of for example at least 20% of the center frequency. Advantageously, this enables the predistortion linearizer to operate over a wide frequency range, enabling a single design of device to be used in a wide range of different applications, thereby enabling the design and manufacturing costs to be reduced.

A delay line may be incorporated in one of the signal paths in order to provide a phase difference between the first and second signals, in addition to that that can be provided by the vector modulator.

According to another aspect of the present invention, there is provided a vector modulator comprising a signal separator for dividing a signal into a first modulator signal and a second modulator signal, a first path for carrying the first modulator signal, a second path for carrying the second modulator signal and a signal combiner for combining the first and second modulator signals received from the first and second paths, wherein the first path includes means for changing the phase of the first modulator signal and means for controlling the amplitude of the first modulator signal, and the second path includes means for controlling the amplitude of the second modulator signal.

This arrangement enables a vector modulator to be realized having just two variable attenuators to independently control the phase and amplitude of the signals, thereby providing a vector modulator which has few components and can be designed and manufactured at low cost.

In one embodiment, the means for changing the phase between the first and second modulator signals comprises a delay line, which may he implemented simply by making one path longer than the other.

The signal separator and combiner may have any desired bandwidth to enable the vector modulator to operate at the desired frequency and over the desired frequency band.

According to another aspect of the present invention there is provided a predistortion linearizer for a power amplifier comprising: a signal separator for receiving a signal and for dividing the signal into a first signal and a second signal, a first path for carrying the first signal, a second path for carrying the second signal, the second path comprising a non-linear device for receiving the second signal and generating distortion therefrom, amplitude control means in at least one of the first and second paths for controlling the amplitude of the signal carried by the respective path, a variable length delay line in one of the first and second paths for enabling a phase difference between the first and second signals to be varied, and a signal combiner for combining the signals from the first and second paths into a signal for feeding into a power amplifier.

Advantageously, in this arrangement, the phase difference of the signals in the first and second paths at the input of the signal combiner is produced by arranging one path longer than the other. In other words, it is the difference in path length between the first and second paths which is used to produce the phase difference of the input of the combiner. Advantageously, this arrangement obviates the need for relatively complex and expensive phase shifters and phase shift compensators employed in the prior art arrangements, and offers an inexpensive means of producing the required phase shift.

In one embodiment, the additional length in one of the first and second oaths is provided by a delay line. The delay line may comprise a variable length delay line to enable the phase to be varied.

In one embodiment, the additional length is in the first path.

In one embodiment, the means for attenuating may be arranged for attenuating the input power of the first signal to the amplifier.

In one embodiment, the means for attenuating comprises a variable attenuator, for example, a voltage controlled attenuator.

In one embodiment, the means for attenuating the power of the distorted signal from the non-linear device comprises a variable attenuator.

In one embodiment, the signal separator comprises a wideband signal separator. Advantageously, this assists in enabling the same linearizer to be used over a wide range of different frequencies.

In one embodiment, the signal separator has a bandwidth of at least 20% of the center frequency of the input signal.

In one embodiment, the signal combiner comprises a wideband coupler.

In one embodiment, the wideband coupler has a bandwidth of at least 20% of the center frequency of the input signal.

BRIEF DESCRIPTION OF THE DRAWINGS

Examples of embodiments of the present invention will now be described with reference to the drawings, in which.

DESCRIPTION OF EMBODIMENTS

Figure 1:
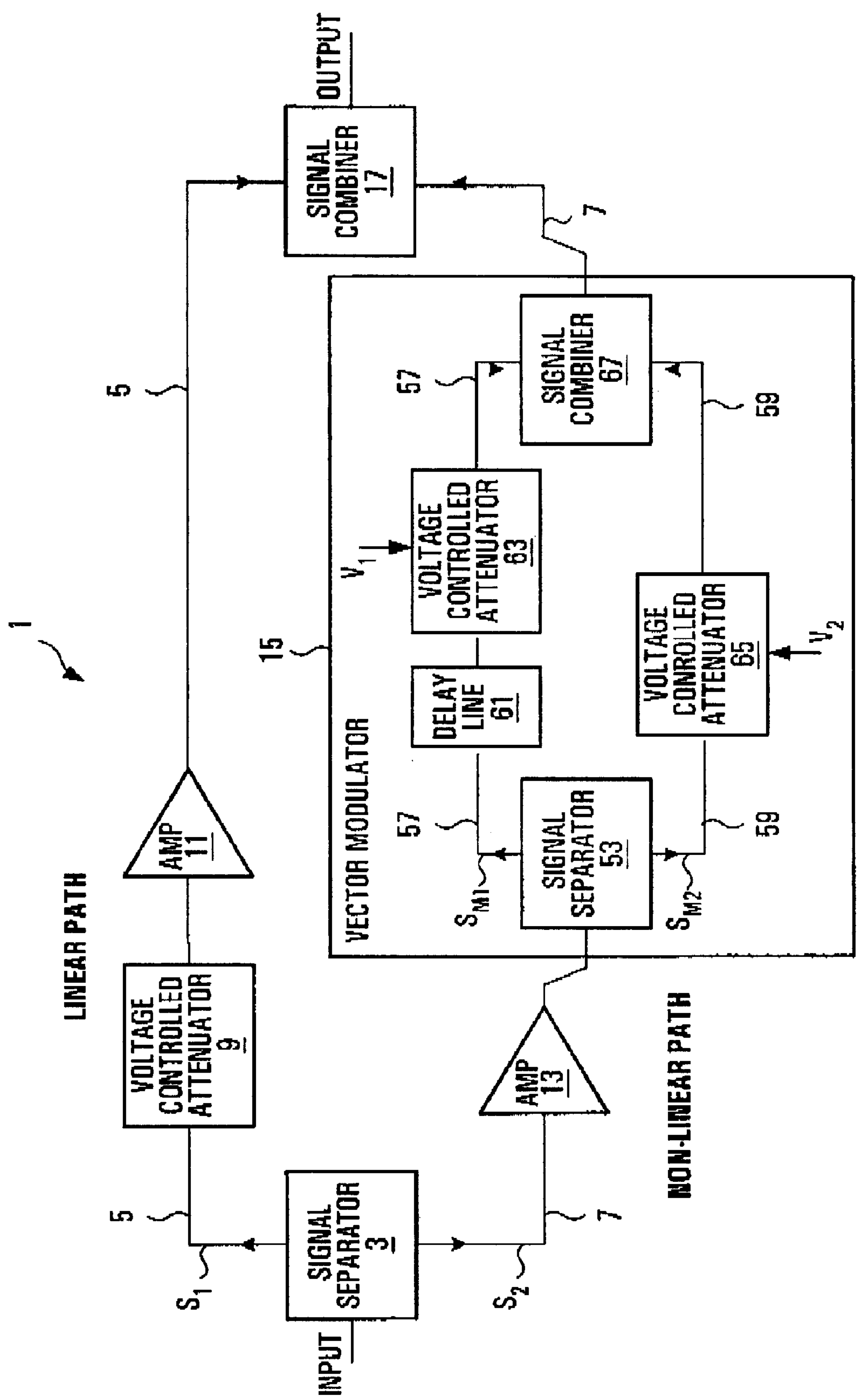
FIG. 1 shows a block diagram of a linearizer according to an embodiment of the present invention.

Referring to FIG. 1, a linearizer 1 comprises a signal separator 3 for dividing an input signal into a first and second signal, $S_1$, $S_2$, and a first signal path 5 for carrying the first signal and a second signal path 7 for carrying the second signal. The first signal path which, in this embodiment, serves as the linear path, comprises an attenuator 9 and a linear amplifier 11. The second path, which serves as a non-linear path comprises a non-linear device 13, and a vector modulator 15. The non-linear device may comprise any device for generating the required distortion signal, and in one embodiment comprises a non-linear amplifier. The linearizer further comprises a signal combiner 17 for receiving and combining signals from the first and second signal paths 5, 7. The signal separator 3 and signal combiner 17 may operate over a typical bandwidth of for example, about 10%, or over a wide bandwidth of for example, at least 20% of the center frequency. The separator and combiner may also be selected for the required center operating frequency.

The linear amplifier 11 in the linear path enables the amplitude of the first signal $S_1$ to be increased, and the variable attenuator 9 enables the amplitude of the first signal to be controlled. The non-linear device 13 in the second path produces distortions from the second signal $S_2$ for use in compensating distortiors of a power amplifier, which may, in use, be coupled to the output of the combiner 17. The non-linear device 13 may comprise a non-linear amplifier which both amplifies the second signal and generates distortion, so that the amplified signal includes one or more amplified signals at the original frequencies, and other frequency components (i.e. the distortion) required to compensate for power amplifier distortion. These other frequencies may include, but are not limited to, third order and fifth order distortions. The vector modulator 15 enables both the phase and amplitude of the distorted second signal to be varied independently of one another, so chat the amplitude of the distortion can be varied, as required, to match that of the power amplifier, and the phase of the distorted signal can also be varied as required.

In operation, the phase of the second signal should be adjusted to enable the distortion generated by the linearizer to cancel the distortion generated by the power amplifier. For an amplifier which has only AM-AM conversion and no AM-PM conversion, the phase is independent of input/output power. In this case, the amplitude of the distorted signal generated by the predistorter required for compensation would be a reverse function of AM-AM conversion of the PA, and the phase difference between the first and second signals would be 180° for complete cancellation. However, most practical amplifiers have a non-linear response function, such that the gain of the power amplifier changes as a function of input power due to amplitude-modulation to amplitude-modulation (AM-AM) conversion, and the phase of the signal changes due to amplitude-modulation to phase modulation (AM-PM) conversion. In a solid state power amplifier (SSPA), the phase increases in one direction with increasing input power, and in a Travelling Wave Tube Amplifier (TWTA), the phase of the signal increases with input power in the opposite sense. Therefore, the phase difference between the first and second signals required to provide full cancellation of the distorted signal generated by the power amplifier is generally different from 180°. For example, in the case of a solid state power amplifier, the required phase difference $\Delta\phi(=\phi_{S1}-\phi_{S2})$ between the first and second signals may be in the range of about −150° to −170°, and for a Travelling Wave Tube amplifier, the required phase difference $\Delta\phi$ between the linear and non-linear path signals may, for example, be +150° to +170°.

The vector modulator allows the amplitude of the distorted signal to be adjusted to compensate for AM-AM conversion.

The required phase difference between the first and second signals may be partially provided by the signal separator, which may, for example, provide a phase difference of 90°, or any other value. The vector modulator provides an adjustable or variable phase difference having a range which is required, for example, to enable the predistorter to be used for power amplifiers having different characteristics, and/or required to enable the power amplifier distortion to be cancelled over a range of different power amplifier signal input levels. (The vector modulator may also provide a constant phase change component.) Advantageously, the vector modulator enables both the amplitude and phase of the non-linear signal to be controlled using just two control signals. This considerably reduces the number of control signals required in comparison to the circuit disclosed in U.S. Pat. No. 5,576,660, which requires two phase shifters and two attenuators to control the predistorted signals.

Figure 2:
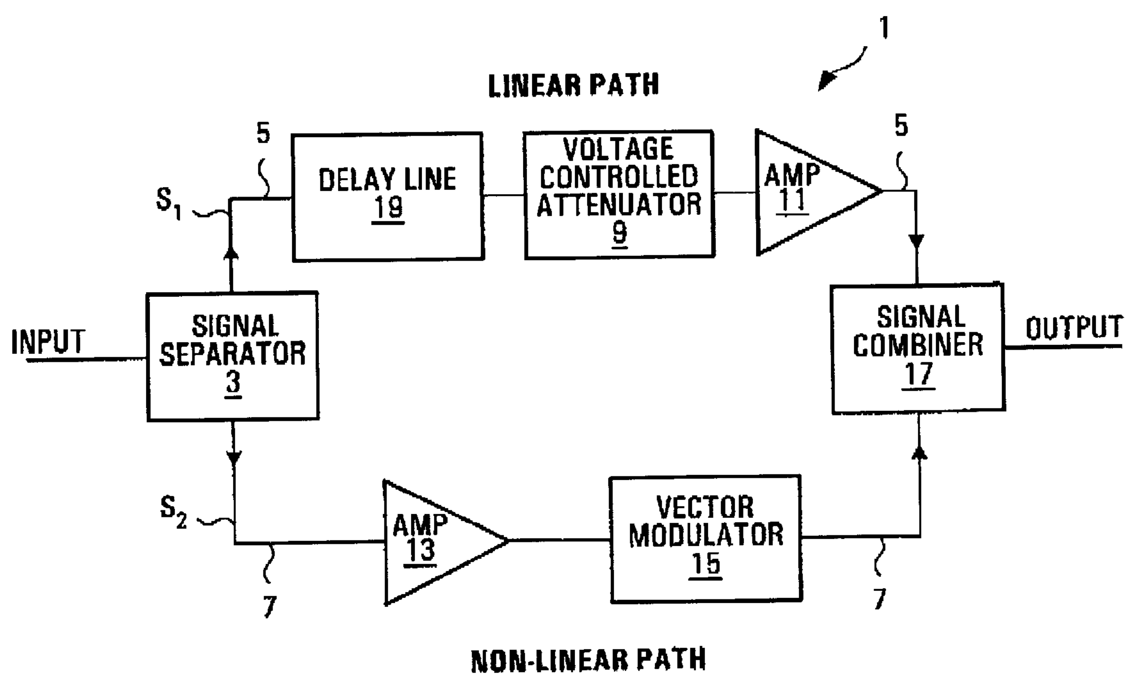
FIG. 2 shows a block diagram of a linearizer circuit according to another embodiment of the present invention.

A predistorter according to another embodiment of the present invention is shown in FIG. 2. The predistorter is similar to that shown in FIG. 1, and like parts are designated by the same reference numerals. The main difference between this embodiment and that shown in FIG. 1, is that the first path 5 includes a delay line 19 to provide a phase difference between the first and second signals and assists in providing the required phase difference between the linear and non-linear paths. As for the embodiment of FIG. 1, the vector modulator enables the phase difference to be adjusted for proper compensation in the non-linearity of the power amplifier. The delay line may comprise a variable delay line to enable the phase to be adjusted, in addition to the vector modulator. However, a fixed delay line will also suffice and may be preferred for reasons of simplicity and low cost. For example, the delay line may be selected according to any additional phase charge that may be required once the phase change produced by the other components of the circuit has been determined.

The delay line may be provided by any suitable means, and may comprise a single component which may be positioned anywhere in the linear path, for example, between the divider 3 and the variable attenuator 9 (as shown in FIG. 2), between the variable attenuator 9 and the amplifier 11, or between the amplifier 11 and combiner 17, or may comprise a plurality of components distributed in the first path 5. Alternatively, or in addition, a delay line may be included in the second path.

Figure 3:
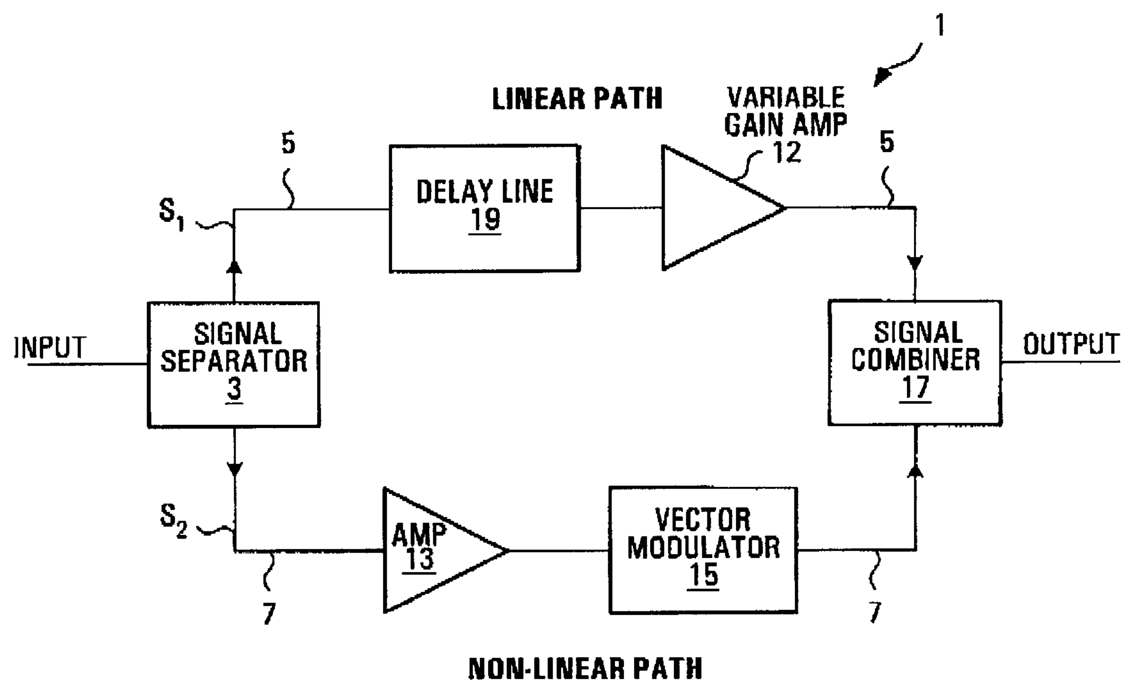
FIG. 3 shows a block diagram of a linearizer circuit according to another embodiment of the present invention.

A predistorter according to another embodiment of the present invention is shown in FIG. 3. This predistorter is similar to the embodiments shown in FIGS. 1 and 2, and like parts are designated by the same reference numerals. The main difference between this embodiment and that shown in FIGS. 1 and 2 is chat the first path 5 in the embodiment of FIG. 3 includes a variable gain amplifier 12, instead of a voltage controlled attenuator 9 and amplifier 11 of the other embodiments. The provision of a variable gain amplifier reduces the number of components in the linear path, which may reduce cost and possible assist in increasing the reliability of the circuit by reducing the number of components.

Figure 4:
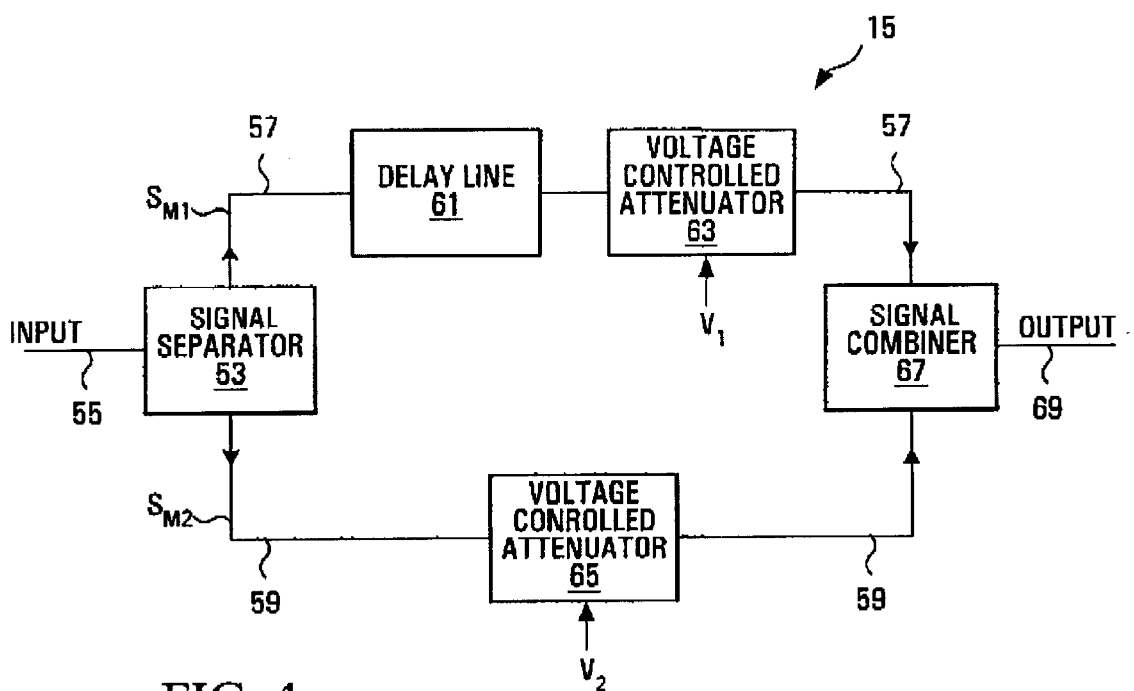
FIG. 4 shows a block diagram of a vector modulator according to an embodiment of the present invention.

An example of a vector modulator according to an embodiment of the present invention, which may be employed in any of the circuits described above and shown in FIGS. 1 to 3, as well as in other embodiments, is shown in FIG. 4. The vector modulator 15 comprises a signal separator 53 for dividing a signal received at the input 55 into first and second modulator signals $S_{M1}$ and $S_{M2}$. The vector modulator 15 includes a first modulator path 57 for carrying the first modulator signal $S_{M1}$ and a second signal path 59 for carrying the second modulator signal $S_{M2}$. The first modulator path 57 includes a delay line 61 and a variable attenuator 63, which may comprise a voltage controlled attenuator. The second modulator path 59 includes a second variable attenuator 65, which may also comprise a voltage controlled attenuator. The vector modulator also includes a signal combiner 67 for combining the first and second signals, and having an output 69 for outputting the confined signal.

The signal separator 53 and signal combiner 67 may comprise any suitable element that can perform the required function, and at least one of the separator and combiner may comprise a Wilkinson combiner or a Lange coupler. If the signal divider and combiner of the predistorter are wideband, it is appropriate to use a wideband signal separator and wideband combiner for the vector modulator, and these may be provided, for example by a Wilkinson or Lange coupler. The type of coupler used for the signal separator may either be the same or different from that used for the combiner. The separator and combiner for the vector modulator may each have a bandwidth of 20% or more.

The delay line 61 provides a phase change in the first modulator signal $S_{M1}$, and is selected according to the phase adjustment that is required by the system. As will now be described with reference to FIG. 5, both the amplitude and phase of the non-linear signal can be varied independently by controlling the voltages $V_1$, $V_2$ applied to the first and second voltage controlled attenuators 63, 65, respectively.

Figure 5:
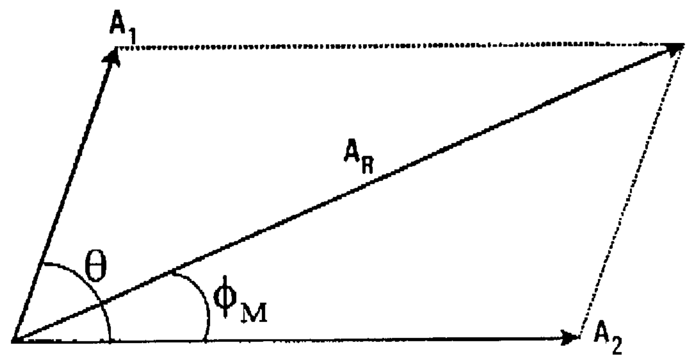
FIG. 5 shows a vector diagram for illustrating the operation of the vector modulator shown in FIG. 4.

FIG. 5 shows a vector diagram of the amplitudes $A_1$, $A_2$ of the fires and second modulator signals separated by an angle $\theta$. This angle of separation is determined by the phase difference between the first and second modulator signals, which is produced by the delay line 61, and any phase difference produced by the signal separator 53. As can be seen from FIG. 5, the phase $\theta_M$ of the resultant signal output from the signal combiner 67 can be varied by varying the difference in amplitudes between the first and second modulator signals. In addition, the amplitude $A_R$ of the resultant signal output from the combiner 67 can be varied by varying the amplitude of the first and second modulator signals. The signal amplitude may be varied independently of the phase angle $\theta_M$ simply by scaling the amplitudes of both the first and second modulator signals by the same factor. To simplify controlling the voltage controlled attenuators, the attenuation characteristics, i.e. the level of attenuation as a function of control voltage for both attenuators may be the same. The range of attenuation may be selected according to the range of amplitude and the range of variable phase angle required for the predistorted signal in order to compensate for power amplifier distortion.

In another embodiment, the delay line may be omitted if the signal separator 53 of the modulator and the voltage controlled attenuators can provide the required phase difference. A delay line may be provided in either of the signal paths.

Other embodiments of the predistorter may include any other suitable form of vector modulator.

Figure 6:
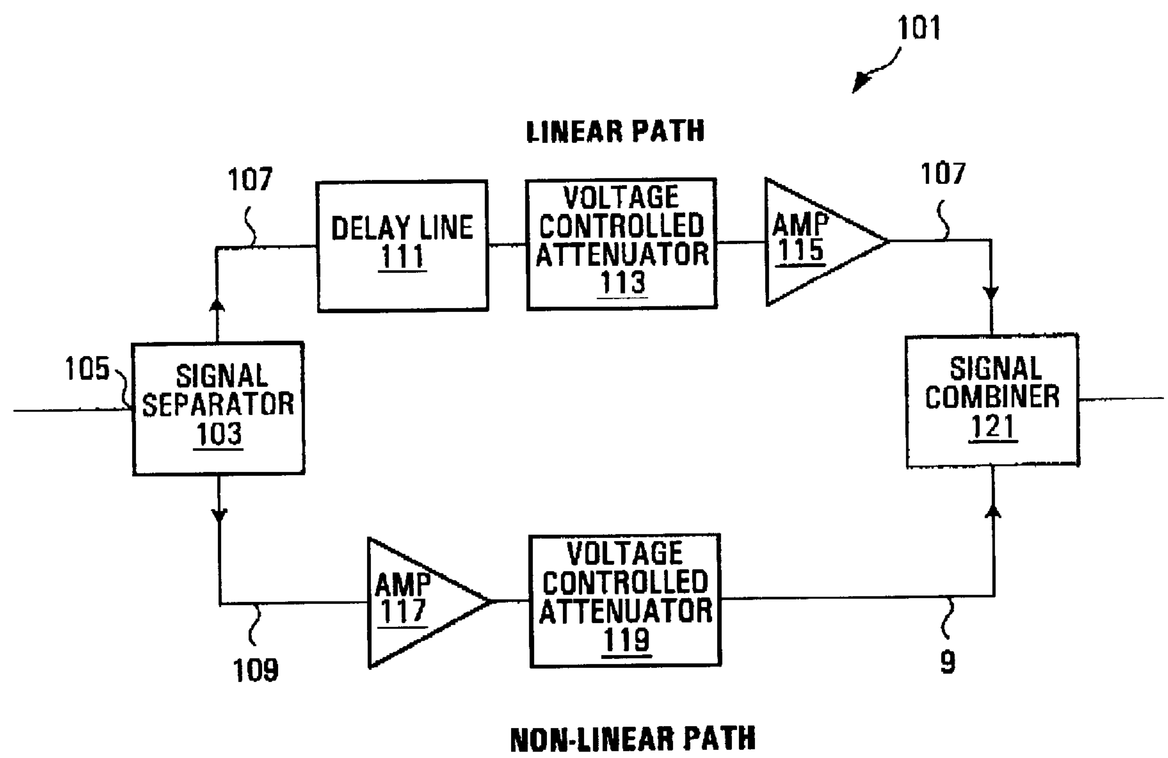
FIG. 6 shows a block diagram of a linearizer according to another embodiment of the present invention.

FIG. 6 shows an example of a predistortion linearizer according to another embodiment of the present invention.

Referring to FIG. 6, a predistortion linearizer, generally shown at 101 comprises a signal separator 103 having an input 105 for receiving a signal, for example, a microwave signal. In this embodiment, the signal separator comprises a wideband coupler, for example having a bandwidth of about 20% of the center frequency or more. The signal separator may or may not apply a phase shift between the first and second signals.

The linearizer further comprises a first path 107 for carrying the first signal and a second path 109 for carrying the second signal from the separator. The first path 107 comprises a delay line 111, an attenuator 113 for attenuating the power of the first signal and an amplifier 115 for amplifying the first signal. Although the delay line 111 is positioned in the first path 107 before the attenuator 113 and the amplifier 115, the delay line 111 may be positioned either between the attenuator 113 and amplifier 117 or after the amplifier 115. Alternatively, the delay line may comprise a distributed delay line between two or more components.

The second path 109 includes a non-linear device 117 coupled to the output of the signal separator 103 for generating distortion from the second signal. In this embodiment, the non-linear device comprises an amplifier 117 although any other suitable non-linear device may be used. The second path further includes an attenuator 119 for attenuating the power of the distorted signal from the non-linear device 117. Either one or both of the attenuators 113, 119 may comprise voltage controlled attenuators.

The linearizer further comprises a signal combiner 121 for combining the signals from the first and second paths 107, 109. In this embodiment, the signal combiner 121 comprises a wideband coupler having a bandwidth of at least 20% of the center frequency. The signal combiner 121 may or may not apply a phase shift between the first and second signals from the first and second paths. The false path 107 may be referred to as the linear path and the second path 109 may be referred to as the non-linear path.

A description of an example of the operation of this embodiment of the linearizer will now be described below.

The non-linear device e.g. in the non-linear path produces distortions, for example amplifier distortions when the predistorter is driven with large signals. It may produce, for example, third order and the fifth order distortions. Through tuning the delay line, the predistorter may provide the required phase difference between the linear path and the non-linear path, for example, in the range of about −150° to −170°. This phase difference may be used to control AM-AM conversion and AM-PM conversion for a Solid State Power Amplifier (SSPA). As described above, for a Travelling Wave Tube Amplifier (TWTA) application, the phase difference between the linear and non-linear path may be, for example, +150° to +170°. This will ensure that the predistorter has enough gain expansion for AM-AM conversion, and enable proper AM-PM conversion at high power levels. The gain expansion can also be controlled by adjusting one or both of the voltage controlled attenuators. Preferably, if a wideband signal separator and combiner is used, the predistorter can cover a bandwidth of 20% or more as long as the delay line is properly tuned. This embodiment provides a simple predistorter that can operate over a wide range of frequencies so that a single design may be used in a wide range of different applications, thereby enabling both design and production costs to be reduced.

In one implementation of the embodiment of FIG. 6, or other embodiments, a Ka-band predistorter is realized. The separator and combiner may be selected to provide the required center frequency and bandwidth. For example, the predistorter may cover a frequency band from 24 GHz to 29 GHz. Two wideband couplers (e.g. Wilkinson or Lange-couplers) may be used so that the predistorter can cover at least 20% bandwidth or more. A delay line is used to adjust or provide the phase difference between the first and second signals for the selected center frequency of operation.

Embodiments of the linearizer may be adapted for use with RF power amplifiers at the desired RF operating frequency and bandwidth, and a single design of linearizer may be employed in a wide range of different applications.

The components of the linearizer in each of the signal paths between the separator and combiner may comprise any suitable components, and arranged in any suitable order that will provide the desired function. For example, a delay line, if used, may be positioned at any suitable location in a signal path, and/or, if an attenuator is used, the attenuator may be positioned, for example either before or after the amplifier.

In other embodiments, the linear amplifier may be omitted from the linear path, if the required signal strength can otherwise be provided by other means. A means for varying the signal strength of the linear path may also be omitted, so that the resulting signal strength of the desired, i.e. undistorted signal may be determined and controlled by means in the non-linear path. However, the provision of means to control the amplitude of the linear signal may be preferred for better control of the linearizer.

Modifications to the embodiments of aspects of the present invention described above will be apparent to those skilled in the art.

What is claimed is:

1. A predistortion linearizer comprising:

a signal separator for receiving an input signal and for dividing the signal into a first signal and a second signal, a first path for carrying said first signal, a second path for carrying said second signal, a signal combiner for combining the signals from the first and second paths, a non-linear device in said second path between said signal separator and said signal combiner for receiving said second signal and generating distortion therefrom, and a vector modulator in one of said first and second paths between said signal separator and said signal combiner for controlling at least one of the amplitude and phase of the signal carried by the respective path, said vector modulator comprising a second signal separator for dividing said signal carried by said respective path into a first modulator signal and a second modulator signal, a first modulator path for carrying said first modulator signal, a second modulator path for carrying said second modulator signal, and a second signal combiner for combining the first and second modulator signals received from the first and second modulator paths, said vector modulator including means for producing a phase difference between said first modulator signal and said second modulator signal, and wherein said first modulator path includes amplitude controlling means for controlling the amplitude of said first modulator signal, and said second modulator path includes amplitude controlling means for controlling the amplitude of said second modulator signal.

2. A predistortion linearizer as claimed in claim 1, wherein said signal separator comprises a wideband signal separator.

3. A predistortion linearizer as claimed in claim 2, wherein said signal separator has a bandwidth of at least 20% of the center frequency of the input signal.

4. A predistortion linearizer as claimed in claim 1, wherein said signal combiner comprises a wideband coupler.

5. A predistortion linearizer as claimed in claim 4, wherein said wideband coupler has a bandwidth of at least 20% of the center frequency of said input signal.

6. A predistortion linearizer as claimed in claim 1, wherein said first path includes a delay line for changing the phase of the first signal relative to the second signal.

7. A predistortion linearizer as claimed in claim 1, wherein said first path includes amplifier means for amplifying said first signal.

8. A predistortion linearizer as claimed in claim 7, further comprising means for controlling the amplitude of said first signal.

9. A predistortion linearizer as claimed in claim 8, wherein said amplitude controlling means includes a variable gain amplifier.

10. A predistortion linearizer as claimed in claim 8, wherein said amplitude controlling means comprises a variable attenuator.

11. A predistortion linearizer as claimed in claim 1, wherein said phase difference producing means comprises a delay line.

12. A predistortion linearizer as claimed in claim 1, wherein said second signal separator comprises a wideband separator.

13. A predistortion linearizer as claimed in claim 12, wherein said wideband signal separator has a bandwidth of at least 20% of the center frequency of the input signal.

14. A predistortion linearizer as claimed in claim 1, wherein said second signal combiner comprises a wideband signal combiner.

15. A predistortion linearizer as claimed in claim 14, wherein said wideband signal combiner has a bandwidth of at least 20% of the center frequency of said input signal.

16. A predistortion linearizer as claimed in claim 1, wherein said amplitude controlling means for controlling the amplitude of said first modulator signal comprises a variable attenuator.

17. A predistortion linearizer as claimed in claim 16, wherein said variable attenuator comprises a voltage controlled attenuator.

18. A predistortion linearizer as claimed in claim 1, wherein said amplitude controlling means for controlling the amplitude of said second modulator signal comprises a variable attenuator.

19. A predistortion linearizer as claimed in claim 18, wherein said variable attenuator comprises a voltage controlled attenuator.

* * * * *